United States Patent
Yamaguchi et al.

(10) Patent No.: US 6,922,439 B2
(45) Date of Patent: Jul. 26, 2005

(54) APPARATUS FOR AND METHOD OF MEASURING JITTER

(75) Inventors: Takahiro Yamaguchi, Tokyo (JP); Masahiro Ishida, Tokyo (JP); Mani Soma, Seattle, WA (US)

(73) Assignee: Advantest Corporation, Tokyo (JP)

( * ) Notice: Subject to any disclaimer, the term of this patent is extended or adjusted under 35 U.S.C. 154(b) by 827 days.

(21) Appl. No.: 09/811,153

(22) Filed: Mar. 16, 2001

(65) Prior Publication Data

US 2002/0163958 A1 Nov. 7, 2002

(51) Int. Cl.[7] .............................................. H04B 17/00
(52) U.S. Cl. ........................ 375/226; 375/371; 327/78; 370/516; 324/612
(58) Field of Search ............................... 375/224, 226, 375/227, 371, 354, 360, 362; 327/78, 79; 370/503, 516

(56) References Cited

U.S. PATENT DOCUMENTS

| | | | | |
|---|---|---|---|---|
| 5,923,706 A | * | 7/1999 | Marz | 375/226 |
| 6,240,130 B1 | * | 5/2001 | Burns et al. | 375/226 |
| 6,295,315 B1 | * | 9/2001 | Frisch et al. | 375/226 |
| 6,377,644 B1 | * | 4/2002 | Naudet | 375/371 |

OTHER PUBLICATIONS

Yamaguchi, T., et al., "Extraction of peak–to–peak and RMS sinusoidal jitter using an analytic signal method," Proceedings 18th IEEE VLSI Test Symposium, Montreal, Quebec, Canada, Apr. 30–May 4, 2000, pp. 395–402.

* cited by examiner

*Primary Examiner*—Dac V. Ha
(74) *Attorney, Agent, or Firm*—David N. Lathrop, Esq.; Gallagher & Lathrop

(57) ABSTRACT

A signal under measurement x(t) is transformed into a complex analytic signal $z_c(t)$, and an instantaneous phase of the $x_c(t)$ is estimated using the $z_c(t)$. A linear phase is removed from the instantaneous phase to obtain a phase noise waveform $\Delta\phi(t)$ of the x(t), and the $\Delta\phi(t)$ is sampled at a timing close to a zero-crossing timing of the x(t) to obtain a timing jitter sequence. Then a difference sequence of the timing jitter sequence is calculated to obtain a period jitter sequence. The period jitter sequence is multiplied by a ratio $T_0/T_{k,k+1}$ of the fundamental period $T_0$ of the x(t) and the sampling time interval $T_{k,k+1}$ to make a correction of the period jitter sequence. A period jitter value of the x(t) is obtained from the corrected period jitter sequence.

14 Claims, 13 Drawing Sheets

FIG. 5A          PRIOR ART
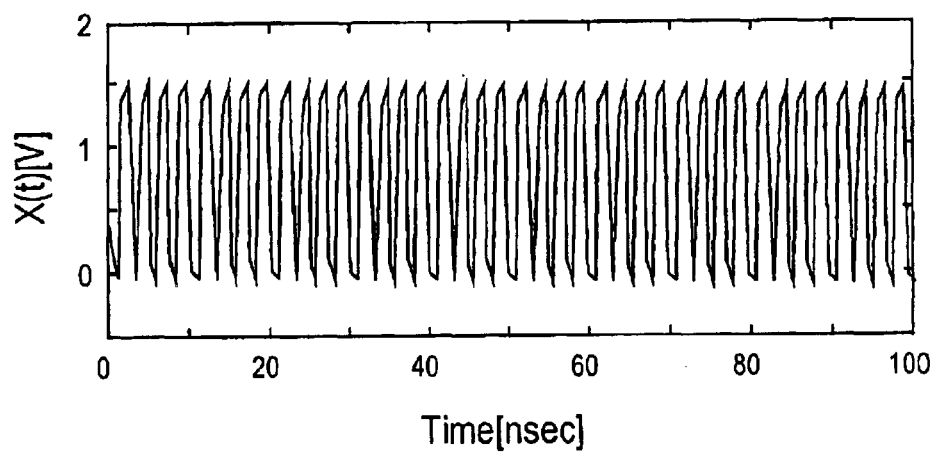
FIG. 5B          PRIOR ART
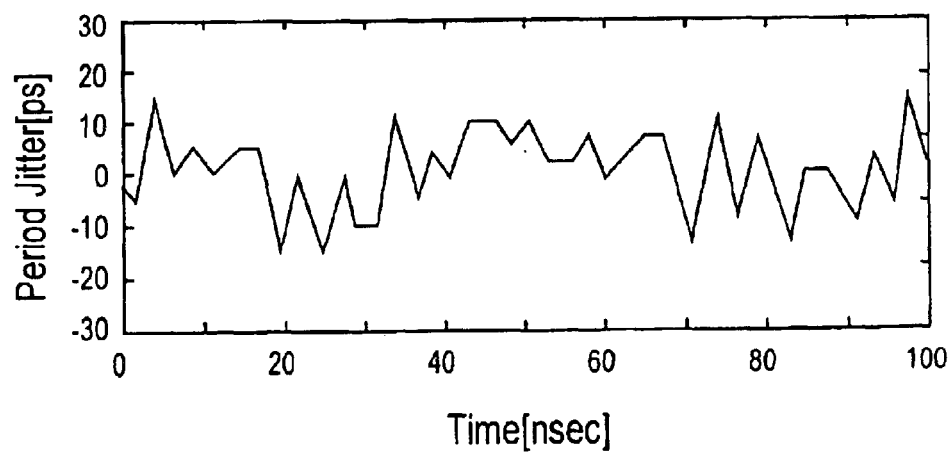

| Method | No. of Events | $J_{RMS}$ | $J_{PP}$ |
|---|---|---|---|
| $\Delta\phi$ Method | 23,255 | 2.4534 ps (+0.5%) | 8.0029 ps (+15.9%) |
| Corrected $\Delta\phi$ Method | 23,255 | 2.4404 ps (-0.004%) | 8.0029 ps (+0.04%) |
| Ideal Value | -- | 2.4405 ps | 6.9028 ps |

FIG. 10A   PRIOR ART
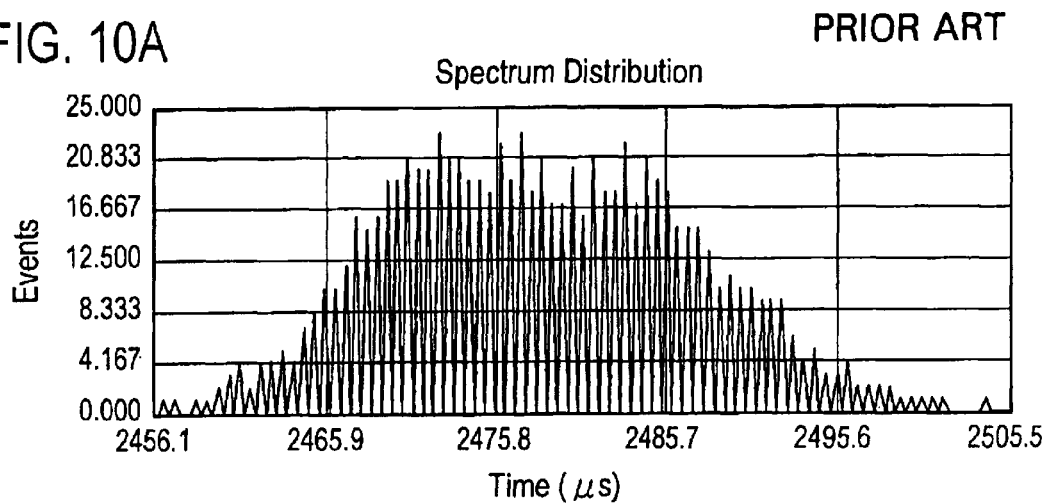
FIG. 10B
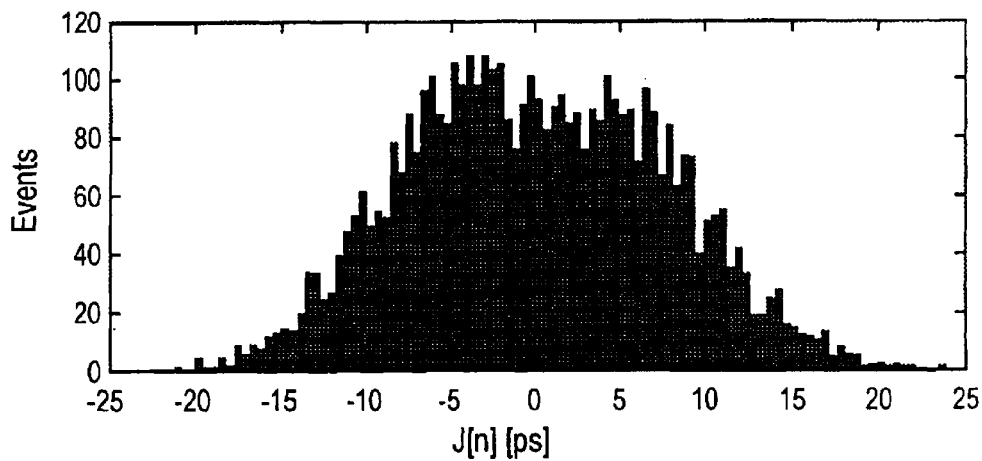
FIG. 11
| Method | No. of Events | $J_{RMS}$ | $J_{PP}$ |
|---|---|---|---|
| Time Interval Analyzer | 10,000 | 7.72 ps | 48.2 ps |
| Corrected $\Delta\phi$ Method | 4,696 | 7.48 ps | 45.2 ps |
| Difference | -53% | -3.1% | +0.4% |

APPARATUS FOR AND METHOD OF MEASURING JITTER

BACKGROUND OF THE INVENTION

The present invention relates to an apparatus for and a method of measuring period jitter that are applied to a measurement of jitter of, for example, a microprocessor clock.

A time interval analyzer and/or an oscilloscope have conventionally been used for the measurement of period jitter. The method of these apparatus is called Zero-crossing Method, in which, as shown in FIG. 1, a clock signal (a signal under measurement) x(t) from, for example, a PLL (Phase-Locked Loop) under test 11 is supplied to a time interval analyzer 12. Regarding a signal under measurement x(t), a next rising edge following one rising edge fluctuates against the preceding rising edge as indicated by dotted lines. That is, a time interval $T_p$ between the two rising edges, namely a period fluctuates. In the Zero-crossing Method, a time interval between zero-crossings (period) of the signal under measurement is measured, a fluctuation of period is measured by a histogram analysis, and its histogram is displayed as shown in FIG. 2. A time interval analyzer is described in, for example, "Phase Digitizing Sharpens Timing Measurements" by D.Chu, IEEE Spectrum, pp. 28–32, 1988, and "A Method of Serial Data Jitter Analysis Using One-Shot Time Interval Measurements" by J. Wilstrup, Proceedings of IEEE International Test Conference, pp. 819–823, 1998.

In addition, Tektronix, Inc. and LeCroy Co. have recently been providing digital oscilloscopes each being able to measure a jitter using an interpolation method. In this jitter measurement method using the interpolation method (interpolation-based jitter measurement method), an interval between data having signal values close to a zero-crossing out of measured data of a sampled signal under measurement is interpolated to estimate a timing of zero-crossing. That is, in order to measure a fluctuation of period, a time interval between zero-crossings (period) is estimated using a data interpolation with a small error.

That is, as shown in FIG. 3, a signal under measurement x(t) from the PLL under test 11 is inputted to a digital oscilloscope 14. In the digital oscilloscope 14, as shown in FIG. 4, the inputted signal under measurement x(t) is converted into a digital data sequence by an analog-to-digital converter 15. A data-interpolation is applied to an interval between data having signal values close to a zero-crossing in the digital data sequence by an interpolator 16. With respect to the data-interpolated digital data sequence, a time interval between zero-crossings is measured by a period estimator 17. A histogram of the measured values is displayed on a histogram estimating part 18, and a root-mean-square value and a peak-to-peak value of fluctuations of the measured time intervals are obtained by an RMS & Peak-to-Peak Detector 19. For example, in the case in which a signal under measurement x(t) has a waveform shown in FIG. 5A, its period jitters are measured as shown in FIG. 5B.

In the jitter measurement method by the time interval analyzer method, a time interval between zero-crossings is measured. Therefore a correct measurement can be performed. However, because this method repeatedly measures jitter but includes an intermediate dead-time between measurements, there is a problem that it takes a long time to acquire a number of data that are required for a histogram analysis. In addition, in an interpolation-based jitter measurement method in which a wide-band oscilloscope and an interpolation method are combined, there is a problem that a histogram of jitter cannot accurately be estimated, and a jitter values are overestimated (overestimation). For example, for a 400 MHz clock signal the time interval analyzer method measure a root-mean-square value of jitter as 7.72 ps while the interpolation method measures, a root-mean-square of 8.47 ps, that is larger than the value estimated by the time interval analyzer method.

On the other hand, inventors of the present invention have proposed a method of measuring a jitter as described below in an article entitled "Extraction of Peak-to-Peak and RMS Sinusoidal Jitter Using an Analytic Signal Method" by T. J. Yamaguchi, M. Soma, M. Ishida, and T. Ohmi, Proceedings of 18th IEEE VLSI Test Symposium, pp. 395–402, 2000. That is, as shown in FIG. 6, an analog clock waveform from a PLL (Phase locked loop) circuit under test 11 is converted into a digital clock signal $x_c(t)$ by an analog-to-digital converter 22, and the digital clock signal $x_c(t)$ is supplied to a Hilbert pair generator 24 acting as an analytic signal transforming part 23, where the digital clock signal $x_c(t)$ is transformed into an analytic signal $z_c(t)$.

Now, a clock signal $x_c(t)$ is defined as follows.

$$x_c(t) = A_c \cos(2\pi f_c t + \theta_c - \Delta\phi(t))$$

The $A_c$ and the $f_c$ are nominal values of amplitude and frequency of a clock signal respectively, the $\theta_c$ is an initial phase angle, and the $\Delta\phi(t)$ is a phase fluctuation that is called an instantaneous phase noise.

Signal components around a fundamental frequency of the clock signal $x_c(t)$ are extracted by a bandpass filter (not shown) and are Hilbert-transformed by a Hilbert transformer 25 in the Hilbert pair generator 24 to obtain the following equation.

$$\hat{x}_c(t) = H[X_c(t)] = A_c \sin(2\pi f_c t + \theta_c - \Delta\theta(t))$$

Then, an analytic signal $z_c(t)$ having $x_c(t)$ and $\hat{x}_c(t)$ as a real part and an imaginary part, respectively, is obtained as follows.

$$\begin{aligned}z_c(t) &= x_c(t) + j\hat{x}_c(t) \\ &= A_c \cos(2\pi f_c t + \theta_c - \Delta\varphi(t)) + jA_c \sin(2\pi f_c t + \theta_c - \Delta\varphi(t))\end{aligned}$$

From this analytic signal $z_c(t)$, an instantaneous phase $\Theta(t)$ of the clock signal $x_c(t)$ can be estimated by the instantaneous phase estimator 26 as follows.

$$\Theta(t) = [2\pi f_c t + \theta_c - \Delta\phi(t)] \bmod 2\pi [\text{rad}]$$

A linear phase is removed from this instantaneous phase $\Theta(t)$ by a linear phase remover 27 to obtain a phase noise waveform $\Delta\phi(t)$. That is, in the linear phase remover 27, a continuous phase converting part 28 applies a phase unwrap method to the instantaneous phase $\Theta(t)$ to obtain a continuous instantaneous phase $\theta(t)$ as follows.

$$\theta(t) = 2\pi f_c t + \theta_c - \Delta\phi(t) [\text{rad}]$$

The phase unwrap method is shown in "A New Phase Unwrapping Algorithm" by Jose M. Tribolet, IEEE Trans. Acoust., Speech, Signal Processing, vol. ASSP-25, pp. 170–177, 1977 and in "On Frequency-Domain and Time-Domain Phase Unwrapping" by Kuno P. Zimmermann, Proc. IEEE. vol. 75, pp. 519–520, 1987.

An instantaneous linear phase of a continuous instantaneous phase θ(t), i.e., a linear instantaneous phase $[2\pi f_c t+\theta_c]$ of a jitter-free ideal signal is estimated by a linear phase evaluator 29 using a linear trend estimating method. That is, an instantaneous linear phase of a continuous instantaneous phase θ(t) is estimated by applying a linear line fitting by least squares method to the above continuous phase θ(t). This estimated linear phase $[2\pi f_c t+\theta_c]$ is subtracted from the continuous phase θ(t) by a subtracting part 31 to obtain a variable term Δϕ(t) of the instantaneous phase Θ(t), i.e., an instantaneous phase noise waveform as follows.

$$\theta(t)=\Delta\phi(t)$$

The instantaneous phase noise waveform Δϕ(t) thus obtained is inputted, after having been sampled by the zero-crossing sampler 34, to a peak-to-peak detector 32 as a timing jitter sequence Δϕ[n], where a difference between the maximum peak value max (Δϕ[k]) and the minimum peak value min (Δϕ[k]) of the Δϕ[n] (=Δϕ(nT)) is calculated to obtain a peak value (peak-to-peak value) $\Delta\phi_{pp}$ of timing jitter as follows.

$$\Delta\phi_{pp} = \max_k(\Delta\phi[k]) - \min_k(\Delta\phi[k])$$

In addition, the timing jitter sequence Δϕ[n] is also inputted to a root-mean-square detector 33, where a root-mean-square (RMS) value of the timing jitter sequence Δϕ[n] is calculated using following equation to obtain a root-mean-square value $\Delta\phi_{RMS}$ of timing jitters.

$$\Delta\phi_{MRS} = \sqrt{\frac{1}{N}\sum_{k=0}^{N-1}\Delta\phi^2[n]}$$

This method is referred to as the Δϕ method, since a peak value of timing jitter (peak-to-peak value) and a root-mean-square value of timing jitters are obtained from the instantaneous phase noise waveform Δϕ(t). Further, an instantaneous phase noise waveform Δϕ(t) is sometimes written as a instantaneous phase noise Δϕ(t) or a phase noise waveform Δϕ(t).

According to the Δϕ method, a timing jitter can be measured at high speed with relatively high accuracy.

It is an object of the present invention to provide an apparatus for and a method of measuring a jitter that can measure a period jitter in a short period of time and with high accuracy, namely an apparatus for and a method of measuring a jitter that can measure jitter values compatible with those measured by the conventional time interval analyzer method.

SUMMARY OF THE INVENTION

According to the present invention, an instantaneous phase noise waveform of a signal under measurement can be obtained, the instantaneous phase noise waveform is sampled at a timing close to each zero-crossing point (approximated zero-crossing point) of the signal under measurement to estimate a timing jitter sequence of the signal under measurement, a difference sequence of this timing jitter sequence is calculated to measure a period jitter sequence, and values of this period jitter sequence is corrected by multiplying a ratio of a fundamental period of the signal under measurement and time interval values between the approximated zero-crossing points.

A principle of the present invention will be explained below. An analytic signal of a fundamental cosine wave x(t) of an input signal (may sometimes be written as a signal under measurement) is given by an equation (1) as follows.

$$z(t) = x(t) + jH[x(t)] \quad (1)$$
$$= A\cos(2\pi f_0 t + \theta - \Delta\phi(t)) + jA\sin(2\pi f_0 t + \theta - \Delta\phi(t))$$

In this case, $f_0$ is a fundamental frequency of the signal under measurement, and is equal to $f_0=1/T_0$ where $T_0$ is a fundamental period of the signal under measurement. An instantaneous frequency of z(t) is expressed by the following equation.

$$\frac{1}{T_0+J} = \frac{\omega(t)}{2\pi} = \frac{1}{2\pi}\frac{x(t)H'[x(t)]-x'(t)H[x(t)]}{x^2(t)+H^2[x(t)]} \; [\text{Hz}] \quad (2)$$
$$= \frac{1}{T_0}\left(1-\frac{T_0}{2\pi}\Delta\phi'(t)\right)$$

Therefore, the following equation is given.

$$T_0+J(t) \approx T_0\left(1+\frac{T_0}{2\pi}\Delta\phi'(t)\right) \; [\text{sec}] \quad (3)$$

A timing jitter sequence is obtained by sampling an instantaneous phase noise waveform Δϕ(t) at a timing (referred to as an approximated zero-crossing point) closest to each zero-crossing point of a real part x(t) of an analytic signal z(t), and then it is assumed that the sampling interval $T_{k,k+1}$ of the approximated zero-crossing points is equal to a fundamental period $T_0$. In this case, a period jitter J is obtained, as shown by the following equation, as a difference sequence of a timing jitter sequence.

$$J[k] = \frac{\Delta\phi[k+1]-\Delta\phi[k]}{\frac{2\pi}{T_0}} \; [\text{sec}] \quad (4)$$

In the equation (4), the division of $2\pi/T_0$ is performed to convert the unit of radian into unit of second.

Since the instantaneous phase noise waveform Δϕ(t) is sampled at sampling points closest to ideal zero-crossing points, as shown in FIG. 7, an approximated zero-crossing point x at which the instantaneous phase noise waveform Δϕ(t) is sampled is deviated from a corresponding ideal zero-crossing point of the signal under measurement ○. That is, a time interval between approximated zero-crossing points x is different from the fundamental period $T_0$. Therefore, when the equation (4) is used, a period jitter cannot be estimated with high accuracy. Particularly in the case where a sampling period is large and an over sampling ratio is small, a measurement error of period jitter becomes large. In order to achieve a smaller error of this type, data of more than 10 points per period $T_0$ (over-sampling ratio is 5) or so are required.

According to the present invention, a correction can be realized using equation (5) by multiplying equation (4) by the ratio of the fundamental period $T_0$ to the time interval between the approximated zero-crossing points $T_{k,k+1}$.

$$J[k] = \frac{\Delta\phi[k+1]-\Delta\phi[k]}{\frac{2\pi}{T_0}}\left(\frac{T_0}{T_{k,k+1}}\right) \; [\text{sec}] \quad (5)$$

where the term, $T_0/T_{k,k+1}$ corrects the instantaneous phase noise difference using the difference-based approximation (equation (4)). A period jitter can be obtained with high accuracy using this correction term. As shown in FIG. 7, the time interval $T_{k,k+1}$ between approximated zero-crossing points can be obtained by differentiating a timing sequence t[k] at the approximated zero-crossing points.

$$T_{k,k+1} = t[k+1] - t[k] \text{ [sec]} \quad (6)$$

In addition, the fundamental period $T_0$ of the signal under measurement may be obtained from an inclination $2\pi/T_0$ of the linear instantaneous phase or may be directly obtained from the signal under measurement.

When the J[k] is corrected by the correction term as shown in FIG. 8, an estimation error (shown in parentheses) between an estimated jitter value and an ideal value with respect to either of an RMS value $J_{RMS}$ and a peak-to-peak value $J_{PP}$ of period jitter can be reduced. The data shown in FIG. 8 were obtained through a computer simulation applied to a signal having sinusoidale jitter. Particularly, when the over-sampling ratio is small, its effect becomes large. In FIG. 8, "$\Delta\phi$ method" shows a case where a correction by $T_0/T_{k,k+1}$ is not applied, and "Corrected $\Delta\phi$ method" shows a case where the correction by $T_0/T_{k,k+1}$ is applied. FIG. 9 shows an experimental result when a real waveform is used. FIG. 9 shows measured jitter values for various numbers of sampling points per period $T_0$. In the case of the $\Delta\phi$ method (indicated by x) where the correction by $T_0/T_{k,k+1}$ is not applied, a peak-to-peak value of period jitter is especially over estimated as the over-sampling ratio is getting smaller. On the other hand, according to the present invention, a peak-to-peak value of period jitter can be obtained correctly, by using the above correction term. Particularly, when the over-sampling ratio is small, its effect becomes large. For example, in the example shown in FIG. 9B, the error can be corrected by 8% in the case of 8 points per period (over-sampling ratio is 4), and by 18% in the case of 3 points per period (over-sampling ratio is 1.5). As a result, according to the present invention, it has become possible to obtain a period jitter up to the case where the over-sampling ratio is 1.5 using the $\Delta\phi$ method. This means that, if the sampling period is the same, a jitter of a signal under measurement having higher frequency can be measured more accurately.

In addition, a period for obtaining a period jitter may be m periods (m=0.5, 1, 2, 3, . . . ). That is, by taking the m=0.5 period, a difference between two timing jitter values at a rising (or falling) zero-crossing point and a next falling (or rising) zero-crossing point may be obtained. Also, by taking the m=2 periods, a difference between two timing jitter values at a rising (or falling) zero-crossing point and a rising (or falling) zero-crossing point after two rising (or falling) points from the first rising (or falling) zero-crossing point may be obtained. By calculating a root-mean-square and a difference between the maximum value and the minimum value of the period jitter data measured in this manner, an RMS value $J_{RMS}$ and a peak-to-peak value $J_{PP}$ of the period jitter can be obtained by the following equations, respectively.

$$J_{RMS} = \sqrt{\frac{1}{M} \sum_{k=1}^{M} J^2[k]} \text{ [sec]} \quad (7)$$

$$J_{PP} = \max_k(J[k]) - \min_k(J[k]) \text{ [sec]} \quad (8)$$

In this case, M is the number of samples of the measured period jitter sequence. FIG. 10 shows a histogram (FIG. 10B) of the period jitter measured by the corrected $\Delta\phi$ method and a histogram (FIG. 10A) measured by the conventional time interval analyzer. Thus the histogram estimated by the corrected $\Delta\phi$ method can be compared with the histogram of the conventional time interval analyzer. In addition, FIG. 11 shows an RMS value and a peak-to-peak value of the period jitter measured by the corrected $\Delta\phi$ method. The corrected $\Delta\phi$ method provides both measured peak-to-peak and RMS jitter values that are comparable to the time interval analyzer method. Note that the peak-to-peak value $J_{PP}$ of the observed period jitter is substantially proportional to a square root of logarithm of the number of events (the number of zero-crossings). For example, in the case of approximately 5000 events, $J_{PP}$=45 ps is a correct value. A $J_{PP}$ error in FIG. 11 is shown assuming that 45 ps is the correct value. As shown in FIGS. 10A, 10B, and 11, the Corrected $\Delta\phi$ method can provide measured jitter values compatible with the conventional measurement method.

Furthermore, the $\Delta\phi$ method can measure a cycle-to-cycle period jitter and a period jitter simultaneously. A cycle-to-cycle period jitter $J_{CC}$ is a period fluctuation between adjacent clock cycles, and is expressed by an equation (9).

$$\begin{aligned} J_{CC}[k] &= T[k+1] - T[k] \\ &= (T_0 + J[k+1]) - (T_0 + J[k]) \\ &= J[k+1] - J[k] \text{ [sec]} \end{aligned} \quad (9)$$

Therefore, by obtaining differences between the period jitter data measured as described above and then calculating their root-mean-square and a difference between the maximum value and the minimum value, an RMS value $J_{CC,RMS}$ and a peak-to-peak value $J_{CC,PP}$ of cycle-to-cycle period jitter can be obtained by equations (10) and (11), respectively.

$$J_{CC,RMS} = \sqrt{\frac{1}{L} \sum_{k=1}^{L} J_{CC}^2[k]} \text{ [sec]} \quad (10)$$

$$J_{CC,PP} = \max_k(J_{CC}[k]) - \min_k(J_{CC}[k]) \text{ [sec]} \quad (11)$$

In this case, L is the number of samples of the measured cycle-to-cycle period jitter data.

BRIEF DESCRIPTION OF THE DRAWINGS

FIG. 5A is a diagram showing a waveform of a signal under measurement;

FIG. 5B is a diagram showing measured period jitter of the signal under measurement;

FIG. 10A is a diagram showing a histogram of period jitter measured by the conventional time interval analyzer method;

FIG. 10B is a diagram showing a histogram of period jitter measured by the Corrected Δφ method according to the present invention;

FIG. 11 is a diagram showing RMS values and peak-to-peak values of period jitter measured by the time interval analyzer method and the Corrected Δφ method;

DETAILED DESCRIPTION OF THE EMBODIMENT

Figure 12:
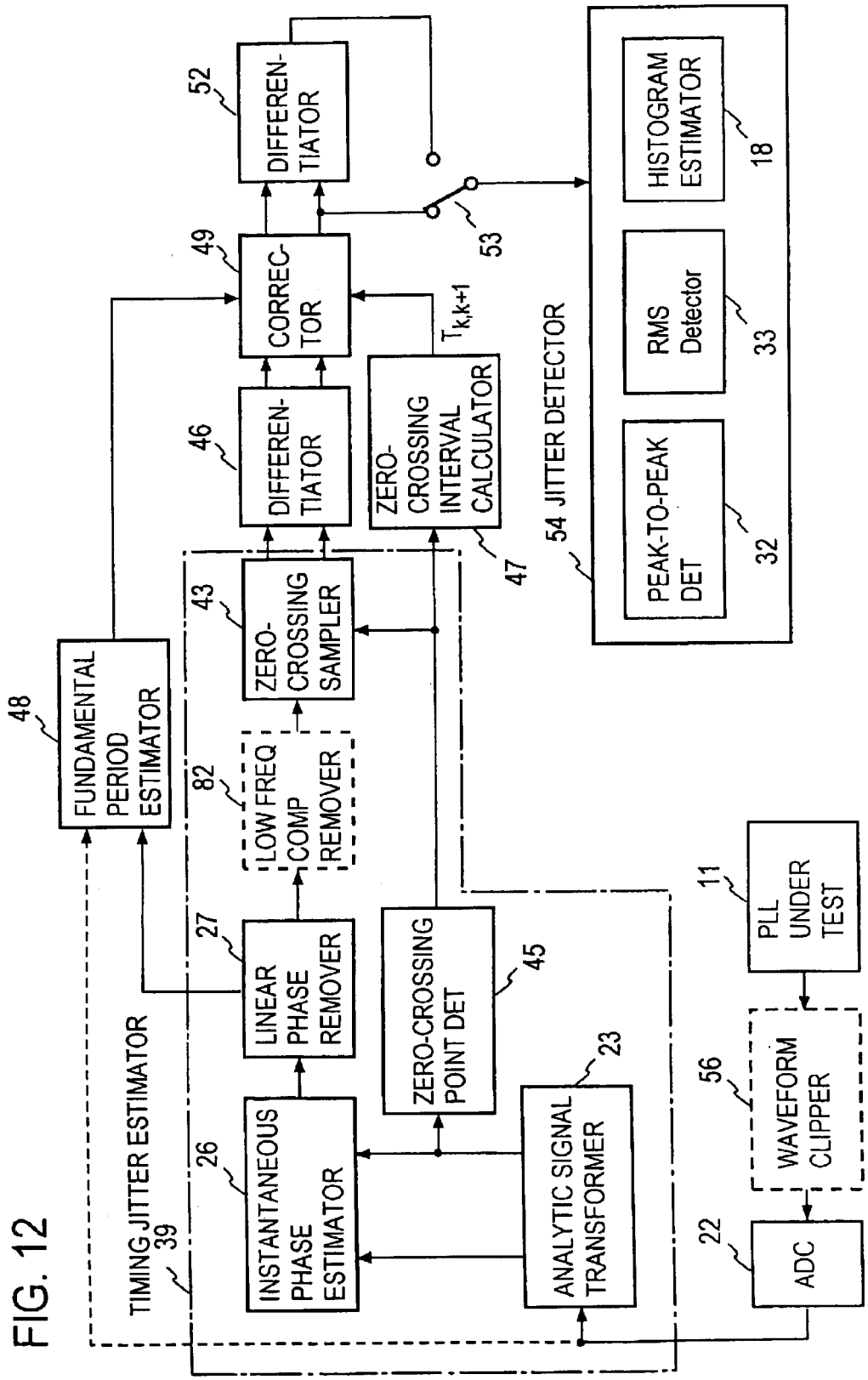
FIG. 12 is a block diagram showing a functional configuration of an embodiment of the present invention.

FIG. 12 shows an embodiment of the present invention. Portions in FIG. 12 corresponding to those in FIG. 6 have the same reference numbers affixed thereto as those in FIG. 6, and duplicated explanations for those portions will be omitted. According to the present invention, a signal under measurement $x_c(t)$ is inputted to a timing jitter estimator 39, and a timing jitter sequence of the inputted signal under measurement is obtained. In this embodiment, an instantaneous phase noise waveform Δφ(t) obtained from a linear phase remover 27 is sampled by a zero-crossing sampler 43 at timings closest to zero-crossing points of a real part $x_c(t)$ of an analytic signal $z_c(t)$ to obtain a timing jitter sequence. For this reason, a real part $x_c(t)$ of an analytic signal from an analytic signal transforming part 23 is inputted to a zero-crossing point detecting part 45.

Next, approximated zero-crossing points are detected by the zero-crossing point detecting part 45. That is, the maximum value of a waveform of an inputted real part $x_c(t)$ is defined as 100% level, and the minimum value is defined as 0% level to calculate 50% level V (50%) of the difference between the 100% level and the 0% level as a zero-crossing level. A difference between a sample value and 50% level V (50%) and a difference between its adjacent sample value and 50% level V (50%), i.e., ($x_c(j-1)-V(50\%)$) and ($x_c(j)-V(50\%)$) are calculated, and further a product of those difference values ($x_c(j-1)-V(50\%)$)×($x_c(j)-V(50\%)$) is calculated. When the $x_c(t)$ crosses 50% level, i.e., zero level, the sign of its sample value $x_c(j-1)-V(50\%)$ or $x_c(j)-V(50\%)$ changes from a negative sign to a positive sign or from a positive sign to a negative sign. Therefore, when the product is negative, it is detected that the $x_c(t)$ has passed the zero level, and a time point j-1 or j at which a smaller absolute value of the sample value $x_c(j-1)-V(50\%)$ or $x_c(j)-V(50\%)$ is detected: an approximate zero crossing point. At each approximated zero-crossing point, a sampling pulse is supplied to the zero-crossing sampler 43.

A sample value sequence outputted from the zero-crossing sampler 43, namely a timing jitter sequence, is inputted to a difference calculating part 46, where a difference sequence of the timing jitter sequence is calculated. That is, the equation (4) is calculated with respect to the inputted Δφ[k] and Δφ[k+1], and upon every update of k, the equation (4) is calculated to estimate a period jitter sequence. In addition, a timing sequence t[k] at each sampling time in the zero-crossing sampler 43 is inputted to a zero-crossing interval calculating part 47, where a time interval $T_{k,k+1}$ between approximated zero-crossing points is obtained through a calculation of the equation (6).

Figure 1:
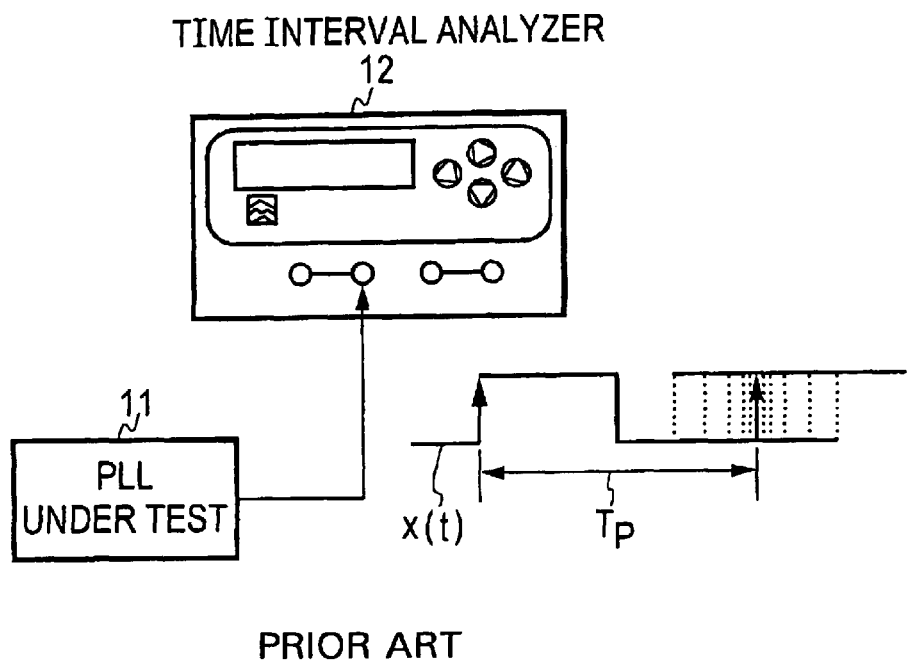
FIG. 1 is a diagram showing a period jitter measurement using a conventional time interval analyzer.
Figure 2:
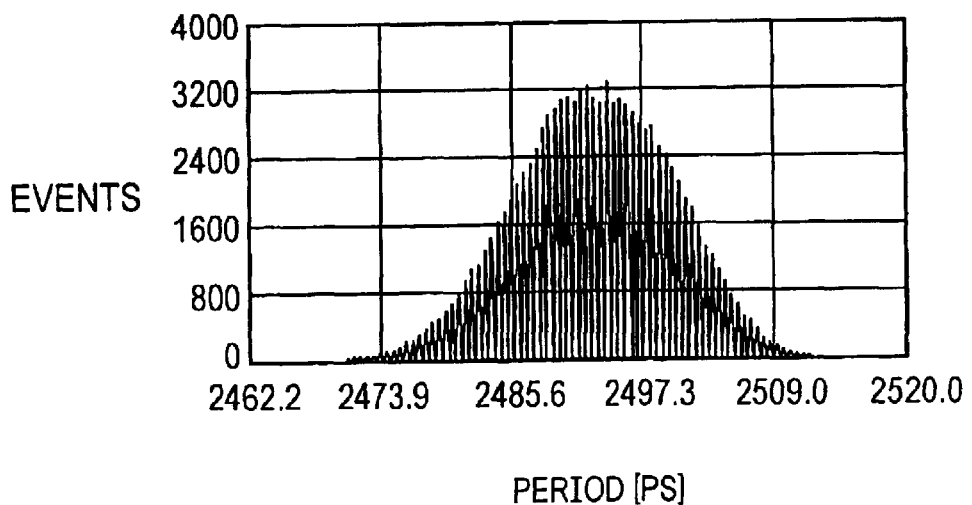
FIG. 2 is a diagram showing a histogram of the measured values.
Figure 3:
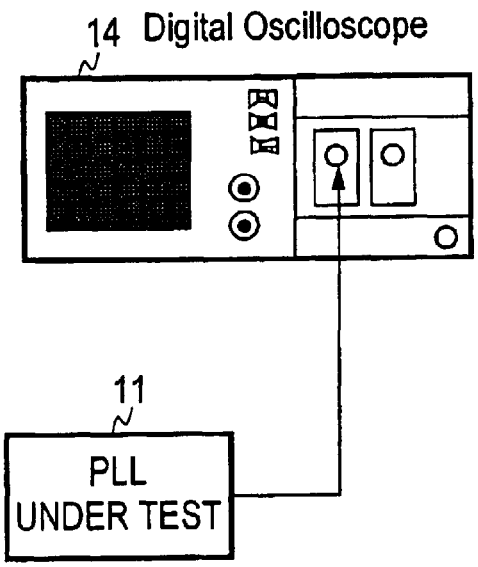
FIG. 3 is a diagram showing a jitter measurement using a conventional digital oscilloscope.
Figure 4:
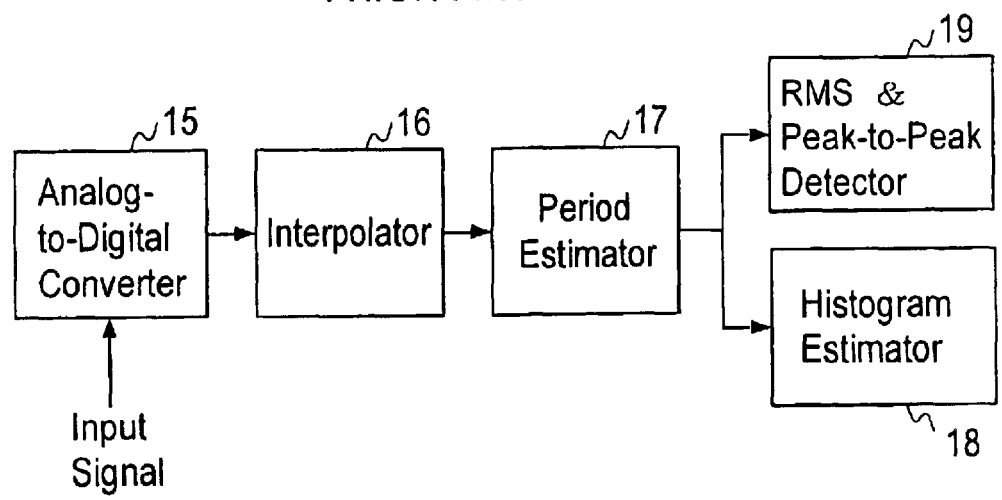
FIG. 4 is a diagram showing a configuration of a jitter measurement part in FIG. 3.
Figure 6:
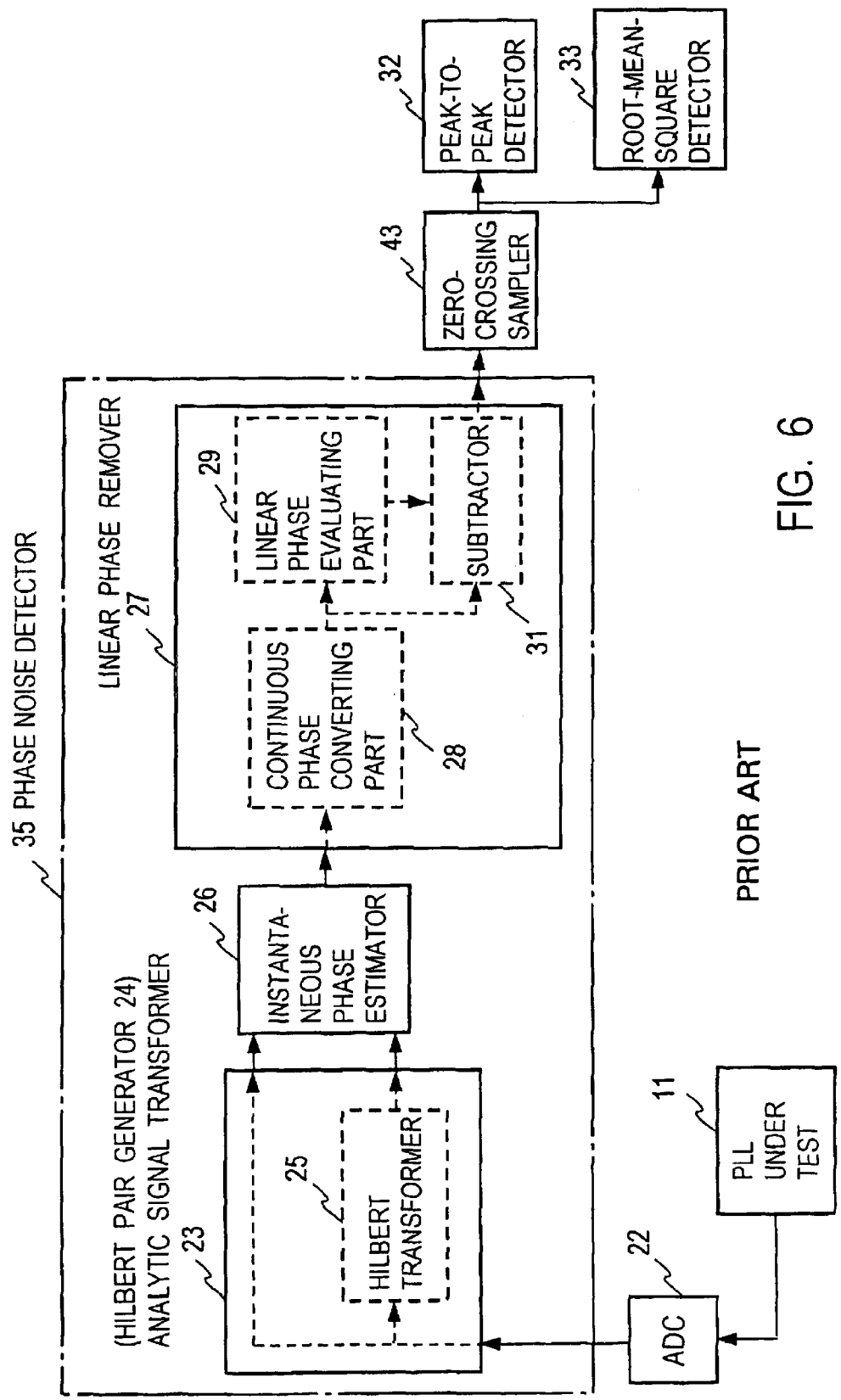
FIG. 6 is a diagram showing a functional configuration of a jitter measurement apparatus based on the $\Delta\phi$ method previously proposed by the inventors of the present invention.
Figures 7, 8:
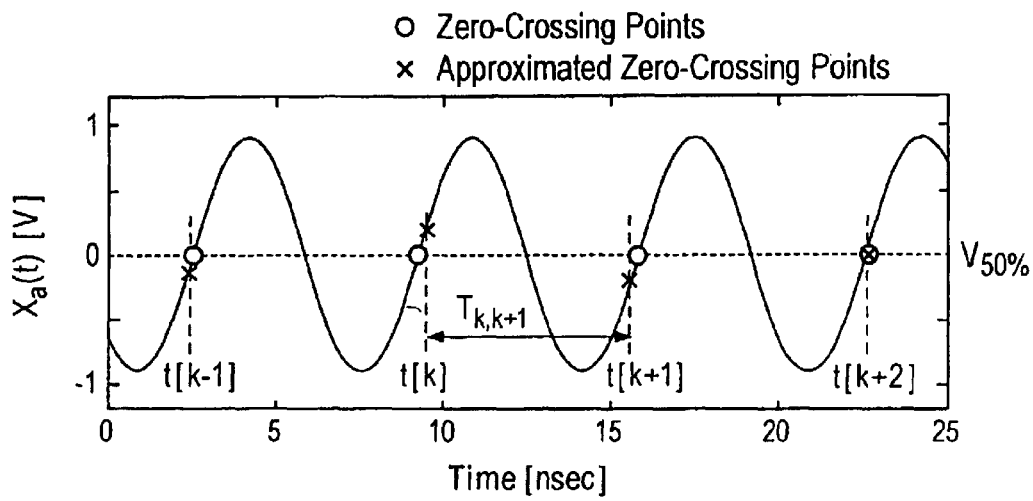
FIG. 7 is a diagram showing a discrepancy between a zero-crossing point and an approximated zero-crossing point.
FIG. 8 is a diagram showing a comparison of measured root-mean-square values and peak-to-peak values of period jitter between the Δφ method and the method by which the period jitter is corrected (the method of the present invention)
Figure 9A:
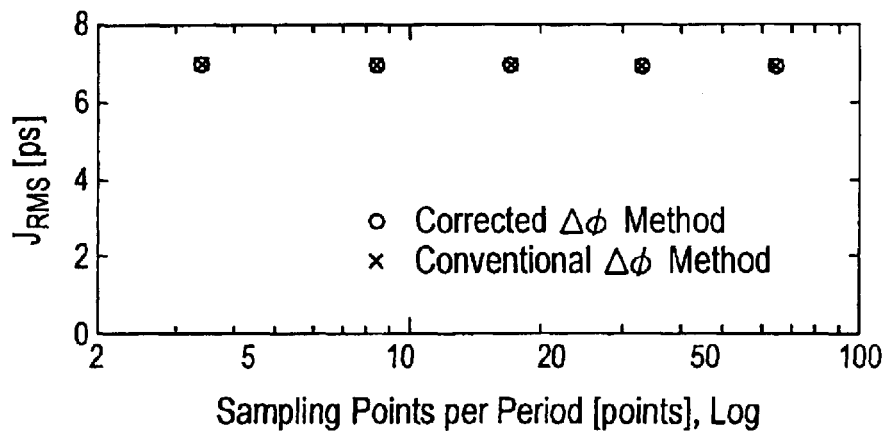
FIG. 9A is a diagram showing an example of the effect of a correction term for an RMS period jitter estimation.
Figure 9B:
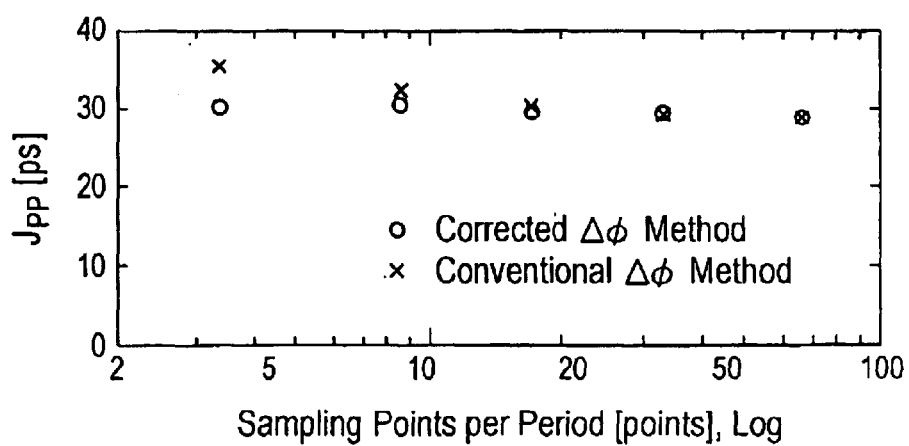
FIG. 9B is a diagram showing an example of the effect of a correction term for a peak-to-peak period jitter estimation.

In addition, an instantaneous linear phase from the linear phase remover 27, namely a linear phase component from the linear phase estimating part 29 in FIG. 6 is inputted to a fundamental period estimating part 48, where a fundamental period $T_0$ is obtained from the inclination $2\pi/T_0$ of the instantaneous linear phase. This fundamental period $T_0$ may be obtained from the signal under measurement itself by inputting the signal under measurement from the AD converter 22 to the fundamental period estimating part 48. Alternatively, when the fundamental period $T_0$ of the signal under measurement is known in advance, that value $T_0$ may be stored in advance in the fundamental period estimating part 48.

A period jitter sequence from a difference calculating part 46, an approximated zero-crossing point interval $T_{k,k+1}$ from the zero-crossing interval calculating part 47, and a fundamental period $T_0$ from the fundamental period estimating part 48 are inputted to a corrector part 49, where each period jitter in the period jitter sequence is multiplied by $T_0/T_{k,k+1}$, namely the equation (5) is calculated to obtain a corrected period jitter sequence.

This corrected period jitter sequence is directly supplied to a cycle-to-cycle period jitter estimating part 52, and at the same time, a period jitter sequence that is the corrected period jitter sequence delayed by its one element (one period jitter) is also supplied to the cycle-to-cycle period jitter estimating part 52.

The cycle-to-cycle period jitter estimating part (differentiator) 52 calculates a difference sequence of the period jitter sequence at each time point k using the equation (9) to obtain a cycle-to-cycle period jitter sequence.

This embodiment is a case where the corrected period jitter sequence from the correcting part 49 and the cycle-to-cycle jitter period jitter sequence are switched by a switch 53 so that one of those corrected period jitter sequence and the cycle-to-cycle jitter period jitter sequence can selectively be supplied to a jitter detecting part 54.

In this case, there are provided in the jitter detecting part 54 a peak-to-peak detecting part 32 for obtaining a difference between the maximum value and the minimum value of the inputted jitter sequence, an RMS detecting part 33 for calculating a root-mean-square (RMS) value of the inputted jitter sequence, and a histogram estimating part 18 for obtaining a histogram of the inputted jitter sequence.

In the state that the switch 53 is connected to the output side of the corrector part 49, the corrected period jitter sequence is inputted to the jitter detecting part 54. In this case, the equation (8) is calculated with respect to the period jitter sequence by the peak-to-peak detecting part 32 to obtain a peak-to-peak value $J_{PP}$ of period jitter, the equation (7) is calculated by the RMS detecting part 33 to obtain an RMS value $J_{RMS}$ of period jitter, and a histogram of period jitter is obtained by the histogram estimating part 18, and then those obtained values are outputted to be displayed on, for example, a display part (not shown).

In the state that the switch 53 is connected to the output side of the cycle-to-cycle period jitter estimating part 52, the cycle-to-cycle period jitter sequence is inputted to the jitter detecting part 54. In this case, the equation (11) is calculated by the peak-to-peak detecting part 32 to obtain a peak-to-peak value $J_{cc,pp}$ of cycle-to-cycle period jitter, and the equation (10) is calculated by the RMS detecting part 33 to obtain an RMS value $J_{CC,RMS}$ of cycle-to-cycle period jitter, and further, a histogram of cycle-to-cycle period jitter is estimated by the histogram estimating part 18. Then those obtained values are also outputted and are displayed on the display part if necessary.

In the configuration shown in FIG. 12, the cycle-to-cycle period jitter estimating part 52 and the switch 53 may be omitted to supply the corrected period jitter sequence from the correcting part 49 directly to the jitter detecting part 54. In addition, the switch 53 may be omitted to supply the cycle-to-cycle period jitter sequence from the cycle-to-cycle period jitter estimating part 52 directly to the jitter detecting part 54. Furthermore, the jitter detecting part 54 may only include any one or two of the peak-to-peak detecting part 32, the RMS detecting part 33, and the histogram estimating part 18. In order to detect approximated zero-crossing points for sampling the instantaneous phase noise $\Delta\phi(t)$, not only the real part signal is utilized but also the signal under measurement itself or its fundamental wave component may be utilized.

As indicated by dashed lines in FIG. 12, a clock signal from the PLL under test 11 can be supplied to the AD converter 22 via a waveform clipper 56 to make amplitude of the clock signal constant. In this arrangement, a jitter can accurately be measured in the state that the phase noise waveform $\Delta\phi(t)$ is not influenced by amplitude modulation components. This process for removing amplitude modulation components from the input signal may be performed at the output side of the AD converter 22.

Figure 13:
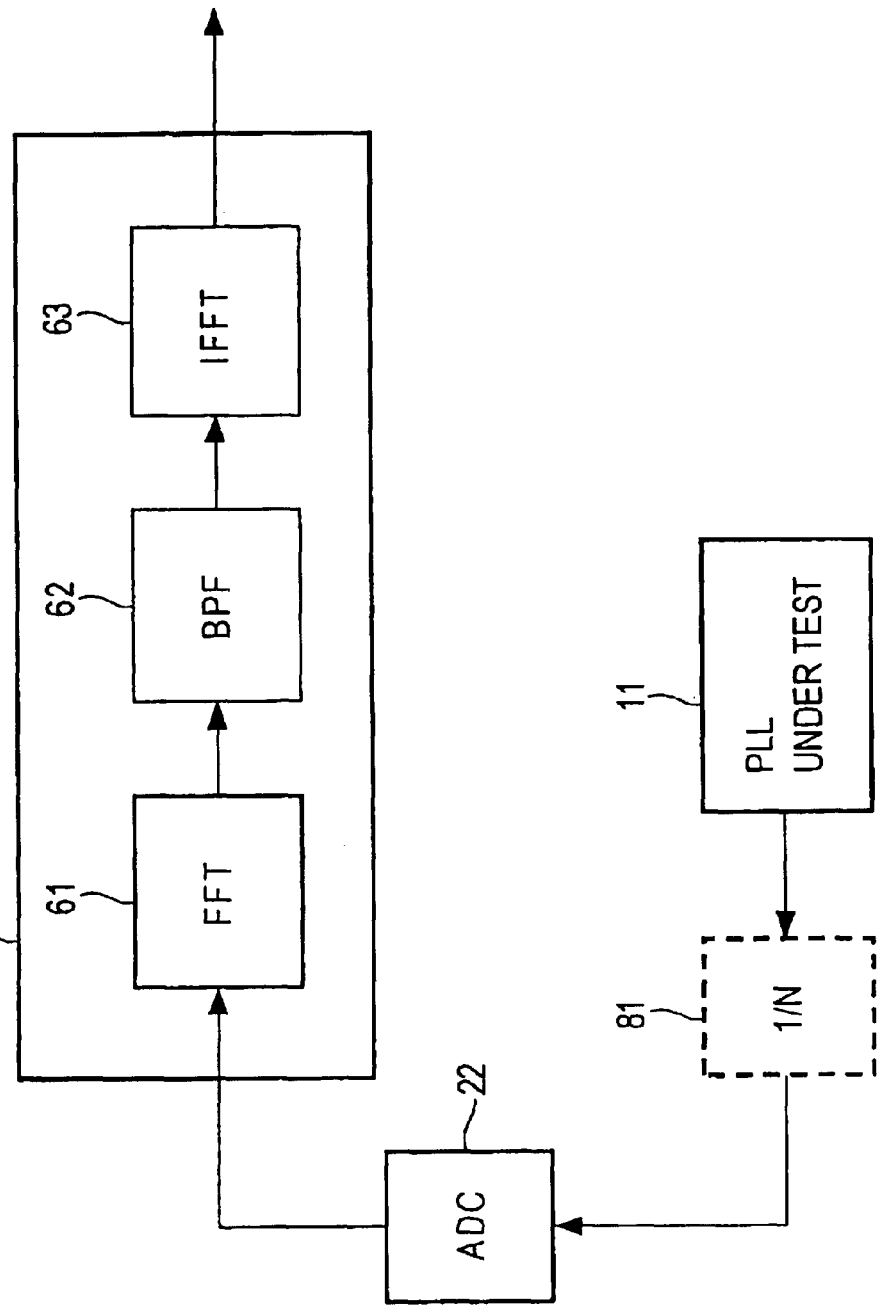
FIG. 13 is a diagram showing a functional configuration of a partially modified example of the present invention.

As shown in FIG. 13, a process of an analytic signal transforming part 23 for transforming an input signal to an analytic signal $z_c(t)$ comprises the steps of transforming a digital input signal from the AD converter 22 into a both-sided spectrum signal in frequency domain using, for example, Fast Fourier Transform (FFT) by the time domain to the frequency domain transforming part 61, making negative frequency components of the both-sided spectra zeros by a bandpass filter 62, with passing frequency components around a positive fundamental frequency of the input clock signal. If necessary, the level of the extracted frequency components is doubled to compensate the energy of the cut off negative frequency components. An output of the bandpass filter 62 is inverse-transformed into the time domain using, for example, Inverse Fast Fourier Transform (IFFT) by the frequency domain to the time domain transforming part 63 to obtain an analytic signal $z_c(t)$.

Figure 14:
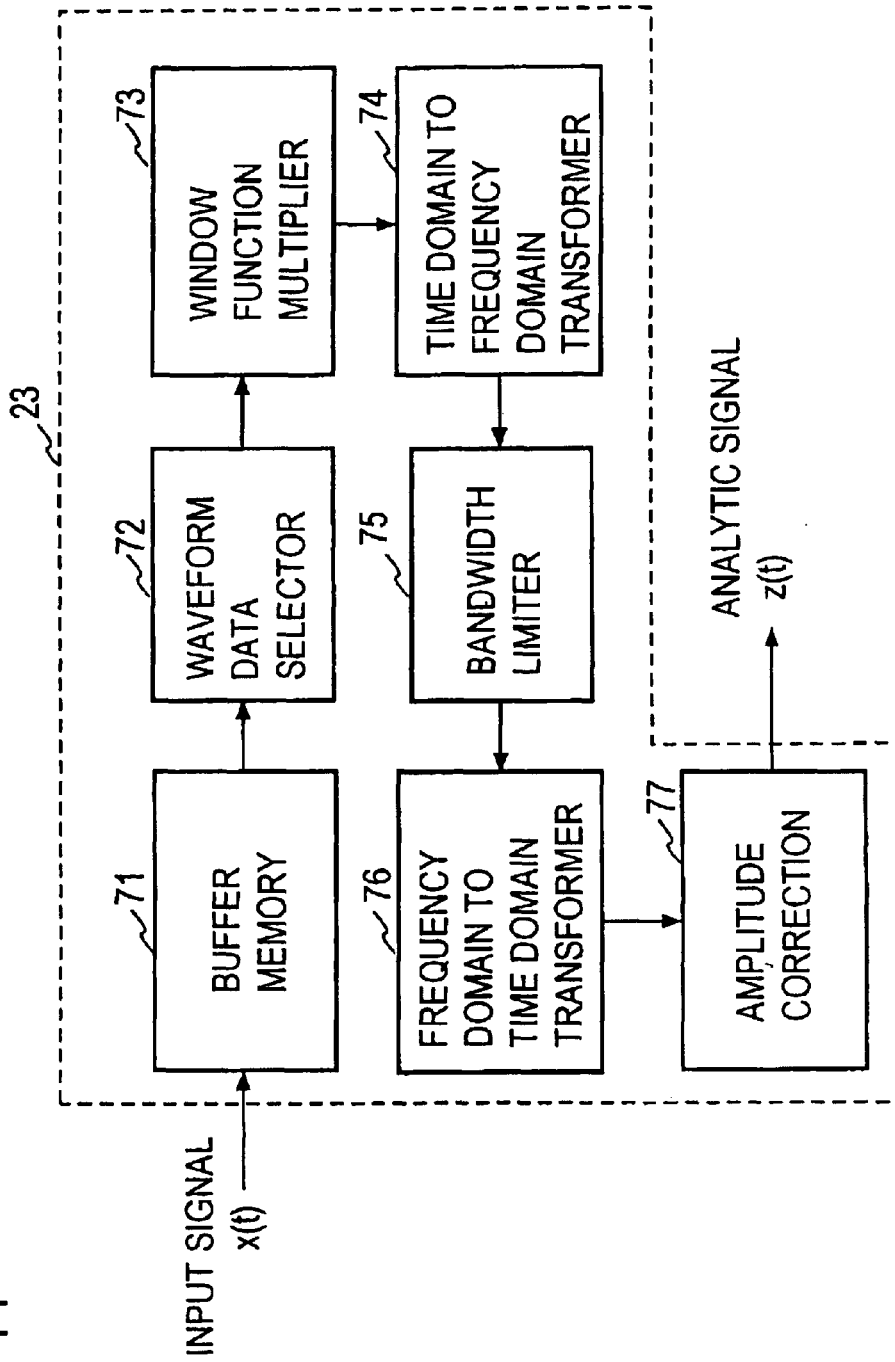
FIG. 14 is a diagram showing another specific functional configuration of the analytic signal transforming part 23.

Furthermore, another example of the analytic signal transforming part 23 will be explained with reference to FIG. 14.

A digitized input signal is stored in a buffer memory 71. A portion of the signal stored in the buffer memory 71 is taken out therefrom by a signal sectioning part 72 in the sequential order such that the current signal section and previous signal section are overlapped with each other. The signal section is multiplied by a window function multiplying part 73, and an output signal of the window function multiplying part 73 is transformed into a both-sided spectrum signal in frequency domain using Fast Fourier Transform by the time domain to the frequency domain transforming part 74. Negative frequency components of this spectrum signal are made zeros to obtain a single-sided spectrum signal. Furthermore, regarding this single-sided spectrum signal, components around a fundamental frequency of the input signal are retained and the other frequency components are made zeros by a bandwidth limiting part 75. This band-limited signal is transformed into the time domain by the frequency domain to the time domain transforming part 76 using Inverse FFT. Then this transformed signal in time domain is multiplied by an inverse window function by an amplitude correction part 77 to obtain an analytic signal.

The input frequency range of the present invention can be extended by using a frequency divider 81, as illustrated by dashed lines in FIG. 13. The frequency-divided clock signal may be supplied to the analytic signal transforming part 23. Alternatively, although not shown, using substantially jitter-free local signal, the clock signal (signal under measurement) may be converted into a signal with difference frequency between those signals to supply the signal to the analytic signal transforming part 23.

As shown by dashed lines in FIG. 12, a low frequency component removing part 82 can be inserted into the output side of the linear phase removing part 27 in series so that low frequency components of the instantaneous phase noise $\Delta\phi(t)$ are removed therefrom, and the instantaneous phase noise $\Delta\phi(t)$ is supplied to the zero-crossing sampler 43. In this manner, it is desirable to remove low frequency components whose frequencies are sufficiently low compared with the frequency $f_0$ of the input signal, for example, to remove frequency components of several kHz in the case of 10 MHz clock so that peak-to-peak jitter is not overestimated.

Figure 15:
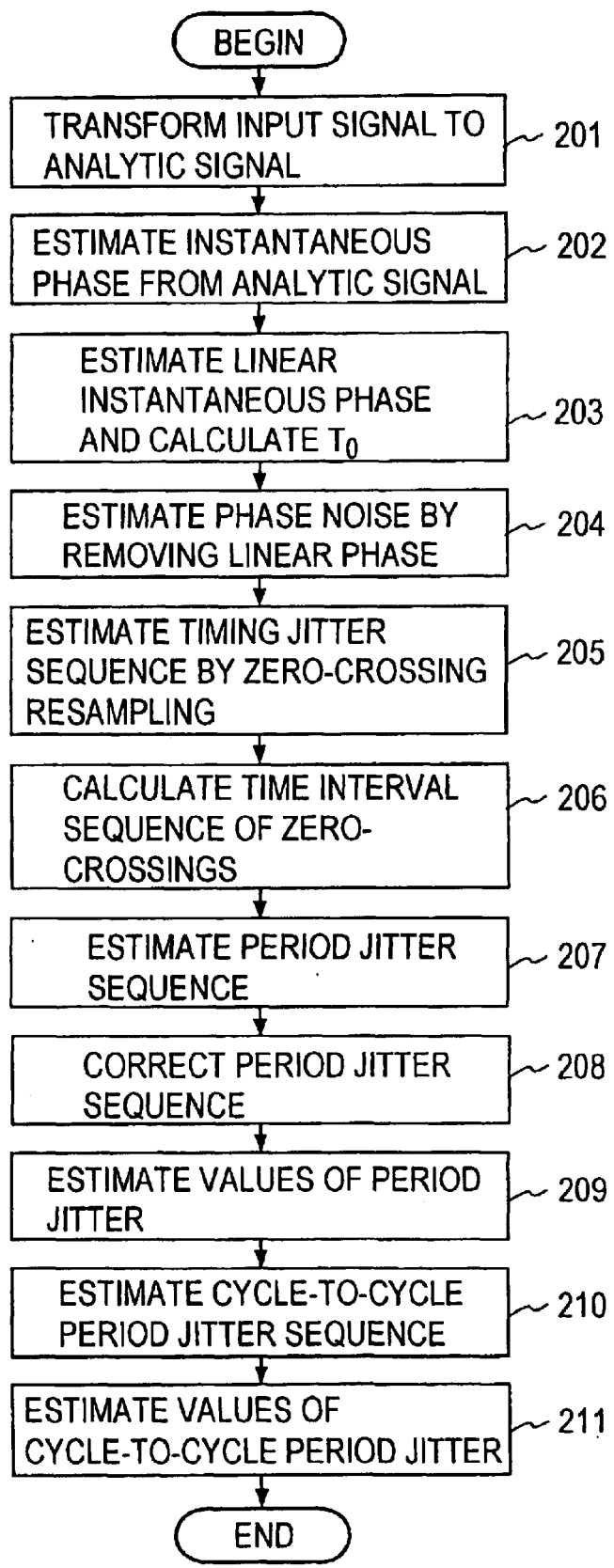
FIG. 15 is a flow-chart showing a procedure of an embodiment of a method according to the present invention.

Next, an embodiment of the method according to the present invention will be explained. FIG. 15 shows a flowchart of the embodiment. This is, an example of the measuring method using the apparatus shown in FIG. 12. First in step 201, the input signal (signal under measurement) is transformed into a band-limited analytic signal by the analytic signal transforming part 23. Next in step 202, an instantaneous phase of the input signal is estimated using the analytic signal by the instantaneous phase estimating part 26, and then in step 203, a linear instantaneous phase corresponding to an ideal clock signal is estimated from this instantaneous phase by the linear phase estimating part 29 (FIG. 6), and the fundamental period $T_0$ of the signal under measurement is obtained by the fundamental period estimating part 48 from the inclination of the linear instantaneous phase. In step 204, a linear phase component is removed from the instantaneous phase by the linear phase removing part 27 to estimate an instantaneous phase noise $\Delta\phi(t)$ of the input signal.

In step 205, data of the instantaneous phase noise $\Delta\phi(t)$ close to zero-crossing timings of a real part of the analytic signal are sampled by the zero-crossing sampler 43 to estimate a timing jitter sequence of the input signal. In step 206, a difference between approximated zero-crossing points from the zero-crossing point estimating part 45 is calculated by the zero-crossing interval calculating part 47 to estimate a zero-crossing time interval sequence.

In step 207, a difference sequence of the timing jitter sequence is calculated by the differentiator 46 to estimate a period jitter sequence of the signal under measurement. In step 208, the period jitter sequence is multiplied by a ratio of the fundamental period $T_0$ and the zero-crossing time interval $T_{k,k+1}$ by the corrector part 49 to correct the difference-based period jitter sequence. In step 209, in the state that the switch 53 is connected to the output side of the corrector part 49, a period jitter of the signal under measurement is obtained by the jitter detecting part 54 from the corrected period jitter sequence.

In step 209, the peak-to-peak detecting part 32 obtains a peak-to-peak value $J_{pp}$ of period jitter using the equation (8), the RMS detecting part 33 obtains an RMS value $J_{RMS}$ of period jitter using the equation (7), and the histogram estimating part 18 obtains a histogram from the period jitter sequence.

In step 210, in the state that the switch 53 is connected to the cycle-to-cycle period jitter estimating part 52, a difference sequence of the corrected period jitter sequence is calculated by the cycle-to-cycle period jitter estimating part 52 to obtain a cycle-to-cycle period jitter sequence of the signal under measurement. In step 211, a cycle-to-cycle period jitter of the signal under measurement is obtained by the jitter detecting part 54 from the cycle-to-cycle period jitter sequence. In this case, the peak-to-peak detecting part 32 obtains a peak-to-peak value $J_{cc,pp}$ of cycle-to-cycle period jitter using the equation (11), the RMS detecting part 33 obtains an RMS value $J_{CC,RMS}$ of cycle-to-cycle period jitter using the equation (10), and the histogram estimating part 18 obtains a histogram of the cycle-to-cycle period jitter.

The estimation of the fundamental period $T_0$ in the step 203 and the calculation of the zero-crossing time interval $T_{k,k+1}$ in step 206 may be performed before the correction in the step 208, and therefore the sequence of those processes is not limited to that of the example described above. In addition, the estimation of the fundamental period $T_0$ may be obtained directly from the signal under measurement. In the case where only period jitter is measured, the steps 210 and 211 may be omitted. In the case where only cycle-to-cycle period jitter is measured, the step 209 may be omitted. In the steps 209 and 211, any one or two of the peak-to-peak value, the RMS value, and the histogram may only be obtained.

In the above description, a clock signal of a microprocessor is mainly discussed as a signal under measurement (input signal). However, the present invention can be applied to a measurement of period jitter and/or cycle-to-cycle period jitter of a clock signal used in another equipment, or of a periodic signal such as sine wave or the like generated by another equipment. In addition, the input signal may be processed in the analog signal form rather than immediately converting it to a digital signal using the AD converter, and thereafter the signal may be converted, in an appropriate processing stage, to a digital signal. The apparatus shown in FIG. 12 may also be functioned by executing a program in a computer.

In the above description, an instantaneous phase noise $\Delta\phi(t)$ is sampled at approximated zero-crossing points to obtain a timing jitter sequence $\Delta\phi[n]$. However, since the liner phase remover 27 has a configuration shown in FIG. 6, the sampling process at the approximated zero-crossing points may be inserted in series, for example as indicated by dashed lines in FIG. 16, between the instantaneous phase estimating part 26 and the continuous phase converting part 28. Alternatively, the sampling process at the approximated zero-crossing points may be inserted in series between the continuous phase converting part 28 and the linear phase estimator 29/subtractor 31. By one of those configurations, the timing jitter sequence $\Delta\phi[n]$ can also be obtained from the subtractor 31.

In addition, the estimation of the instantaneous phase noise $\Delta\phi(t)$ from an instantaneous phase is performed by the configuration of the linear phase remover 27 shown in FIG. 6. Therefore, the processing procedure is, as shown in FIG. 17, that after an instantaneous phase is obtained in the step 202 in FIG. 15, the instantaneous phase is transformed to a continuous phase by the continuous phase converting part 28 in step 203a, an instantaneous linear phase of the continuous phase is estimated by the linear phase estimator 29 in step 203b, and thereafter in step 204, the instantaneous linear phase is removed from the continuous instantaneous phase by the subtractor 31 to obtain an instantaneous noise phase $\Delta\phi(t)$.

Figure 16:
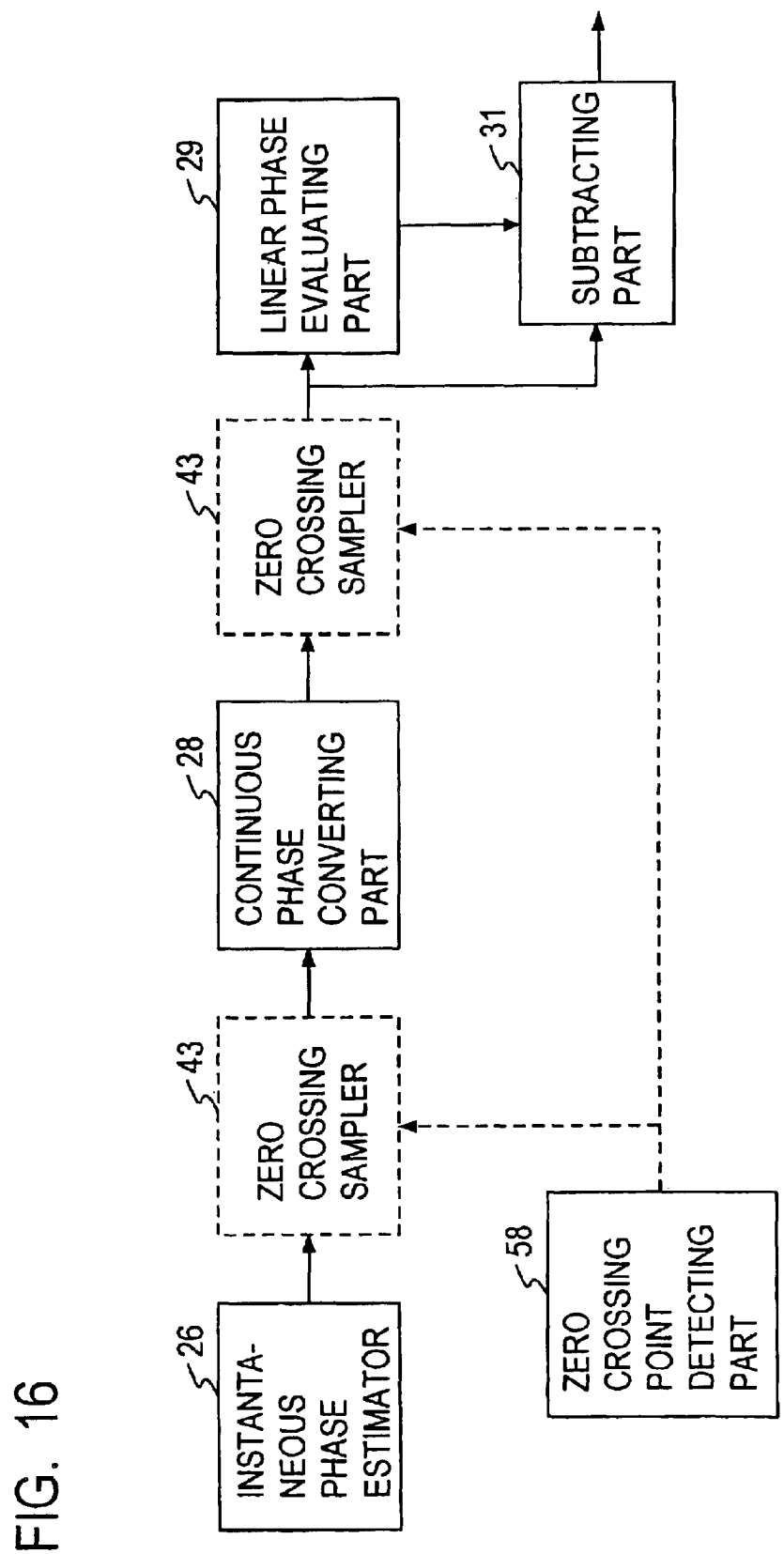
FIG. 16 is a block diagram showing a portion of another embodiment of the apparatus according to the present invention.
Figure 17:
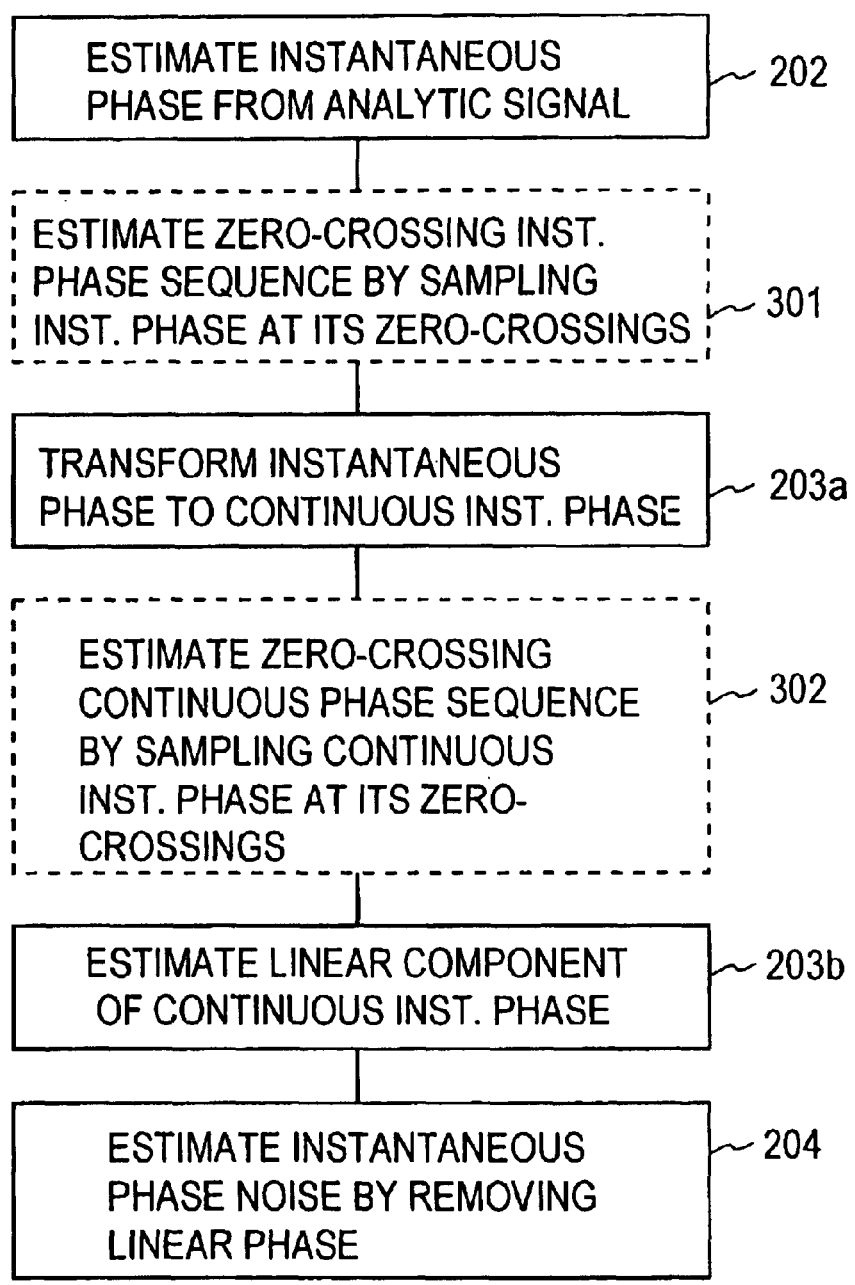
FIG. 17 is a flow-chart showing a portion of another embodiment of a method according to the present invention.

Therefore, similarly to the procedure shown in FIG. 16, as shown in FIG. 17, after the step 202, approximated zero-crossing samplings may be applied to the instantaneous phase in step 301 to obtain a sample sequence of instantaneous phase, and then the process moves to step 203a. In the step 203a, the sample sequence may be transformed to a continuous instantaneous phase.

Alternatively, the continuous instantaneous phase obtained in the step 203a may be sampled at approximated zero-crossing points to obtain a sample sequence of continuous instantaneous phase, and then the process moves to step 203b. In the step 203b, an instantaneous linear phase may be estimated from the sample sequence of continuous instantaneous phase. In either case, in step 204, a timing jitter sequence $\Delta\phi[n]$ that is produced by sampling the instantaneous phase noise at approximated zero-crossing points.

As mentioned above, according to the present invention, estimation errors caused by the sampling at approximated zero-crossing points can be decreased, a measurement result compatible with the conventional time interval analyzer method can be obtained, and in addition, the measurement can be performed in short time compared with the conventional time interval analyzer method.

What is claimed is:

1. An apparatus for measuring a jitter of a signal under measurement comprising:

a timing jitter estimator to which the signal under measurement is inputted for obtaining its timing jitter sequence;

a first differentiator to which the timing jitter sequence is inputted for calculating a first difference sequence to output a period jitter sequence;

a corrector part to which the period jitter sequence is inputted for multiplying the period jitter sequence by a number equal to a fundamental period of the signal under measurement divided by an approximated zero-crossing point interval to output a corrected period jitter sequence; and a jitter detecting part to which the corrected period jitter sequence is inputted for obtaining a jitter of the signal under measurement.

2. The apparatus for measuring a jitter of the signal under measurement according to claim 1 further including a second differentiator to which the corrected period jitter sequence is inputted for calculating a second difference sequence to output the second difference sequence to said jitter detecting part as a cycle-to-cycle period jitter, said second differentiator being inserted between said corrector part and said jitter detecting part.

3. The apparatus for measuring a jitter of the signal under measurement according to claim 1 or 2 further including a zero-crossing point detecting part to which a real part of a complex analytic signal is inputted for obtaining a point close to its zero-crossing timing to output a sampling timing sequence, wherein said timing jitter estimator comprises;

an analytic signal transforming part to which the signal under measurement is inputted for transforming the signal under measurement into the complex analytic signal;

an instantaneous phase estimating part to which the complex analytic signal is inputted for obtaining an instantaneous phase of the complex analytic signal;

a continuous phase converting part for converting the instantaneous phase to a continuous instantaneous phase;

a linear phase estimating part to which the continuous instantaneous phase is inputted for obtaining a linear phase of a continuous instantaneous phase;

a subtracting part to which the linear phase and the instantaneous phase are inputted for removing the linear phase from the instantaneous phase to obtain the instantaneous phase noise; and a zero-crossing sampler for outputting a sampled signal by sampling an input signal using the sampling timing sequence, said zero-crossing sampler being inserted either:

between said instantaneous phase estimating part and said continuous phase converting part, wherein the input signal is received from said instantaneous phase estimating part and the sampled signal is outputted to said continuous phase converting part, between said continuous phase converting part and said linear phase estimating part/subtracting part, wherein the input signal is received from said continuous phase converting part and the sampled signal is outputted to said linear phase estimating part/subtracting part, or between said subtracting part and said first differentiator, wherein the input signal is received from said subtracting part and the sampled signal is outputted to said first differentiator.

4. The apparatus for measuring a jitter of the signal under measurement according to claim 3 further including a zero-crossing interval calculating part to which an output timing sequence of the sampling timing sequence is inputted from said zero-crossing point detecting part for calculating a third difference sequence to obtain approximated zero-crossing point intervals in a sequential order, and for outputting the approximated zero-crossing point intervals to said corrector part.

5. The apparatus for measuring a jitter of the signal under measurement according to claim 4 further including a fundamental period estimating part to which the linear phase is inputted from said linear phase estimating part for obtaining the fundamental period from its inclination, and for outputting the fundamental period to said corrector part.

6. The apparatus for measuring a jitter of the signal under measurement according to claim 4 further including a fundamental period estimating part to which the signal under measurement is inputted for obtaining its fundamental period, and for outputting the fundamental period to said corrector part.

7. The apparatus for measuring a jitter of the signal under measurement according to claim 3 further including a waveform clipper to which the signal under measurement is inputted for removing its amplitude modulation components in the state that its phase modulation components are kept therein to supply the signal under measurement from which the amplitude modulation components have been removed to said timing jitter estimator.

8. A method of measuring a jitter of a signal under measurement comprising:

a step of obtaining a timing jitter sequence of the signal under measurement;

a step of calculating a difference sequence of the timing jitter sequence to generate a period jitter sequence;

a step of multiplying the period jitter sequence by a number equal to a fundamental period $T_0$ and divided by an approximated zero-crossing point interval to obtain a corrected period jitter sequence; and a step of obtaining a period jitter of the signal under measurement from the corrected period jitter sequence.

9. A method of measuring a jitter of a signal under measurement comprising:

a step of obtaining a timing jitter sequence of the signal under measurement;

a step of calculating a difference sequence of the timing jitter sequence to generate a period jitter sequence;

a step of multiplying the period jitter sequence by a number equal to a fundamental period $T_0$ divided by an approximated zero-crossing point interval to obtain a corrected period jitter sequence;

a step of calculating a difference sequence of the corrected period jitter sequence to generate a cycle-to-cycle period jitter sequence; and a step of obtaining a cycle-to-cycle period jitter of the signal under measurement from the cycle-to-cycle period jitter sequence.

10. The method of measuring a jitter of the signal under measurement according to claim 8 or 9 further including a step of obtaining a point close to a zero-crossing timing of a real part of a complex analytic signal to obtain an approximated zero-crossing point, wherein said step of obtaining a timing jitter sequence comprises:

a step of transforming the signal under measurement to a complex analytic signal;

a step of obtaining an instantaneous phase of the signal under measurement from the complex analytic signal;

a step of transforming the instantaneous phase to a continuous instantaneous phase;

a step of obtaining a linear phase from the continuous instantaneous phase;

a step of removing the linear phase from the continuous instantaneous phase to obtain an instantaneous phase noise; and a step of sampling any one of the instantaneous phase, the continuous instantaneous phase and the instantaneous phase noise at the approximated zero-crossing point.

11. The method of measuring a jitter of the signal under measurement according to claim 10 further including a step of calculating a difference sequence of a timing sequence that represents approximated zero-crossing points to obtain the approximated zero-crossing point intervals in a sequential order.

12. The method of measuring a jitter of the signal under measurement according to claim 11 further including a step of obtaining the fundamental period from an inclination of the linear phase.

13. The method of measuring a jitter of the signal under measurement according to claim 11 further including a step of obtaining the fundamental period from the signal under measurement.

14. The method of measuring a jitter of the signal under measurement according to claim 10 further including a step of removing amplitude modulation components of the signal under measurement in the state that its phase modulation components are kept therein to move to said step of obtaining a timing litter sequence.

* * * * *